United States Patent
Myers et al.

(10) Patent No.: US 7,538,425 B2
(45) Date of Patent: May 26, 2009

(54) POWER SEMICONDUCTOR PACKAGE HAVING INTEGRAL FLUID COOLING

(75) Inventors: Bruce A. Myers, Kokomo, IN (US); Darrel E. Peugh, Kokomo, IN (US); Lester Wilkinson, Kokomo, IN (US); Erich W. Gerbsch, Cicero, IN (US)

(73) Assignee: Delphi Technologies, Inc., Troy, MI (US)

( * ) Notice: Subject to any disclaimer, the term of this patent is extended or adjusted under 35 U.S.C. 154(b) by 174 days.

(21) Appl. No.: 10/900,538

(22) Filed: Jul. 28, 2004

(65) Prior Publication Data
US 2006/0022334 A1    Feb. 2, 2006

(51) Int. Cl.
*H01L 23/34*    (2006.01)

(52) U.S. Cl. ............... 257/714; 257/730; 257/E23.095

(58) Field of Classification Search ........... 257/724, 257/714, 715, 716, 717, 678, 685–686, 712–713, 257/722, 730, 731, 773, 786, E23.095, E23.097, 257/E23.098
See application file for complete search history.

(56) References Cited

U.S. PATENT DOCUMENTS

| | | | |
|---|---|---|---|
| 5,901,037 A | 5/1999 | Hamilton et al. | |
| 6,175,154 B1 * | 1/2001 | Gillespie | 257/750 |
| 6,796,370 B1 * | 9/2004 | Doll | 165/80.4 |
| 7,357,898 B2 * | 4/2008 | Samper et al. | 422/100 |
| 2003/0110788 A1 * | 6/2003 | Koeneman et al. | 62/259.2 |
| 2003/0132511 A1 | 7/2003 | Gerbrsch et al. | |

FOREIGN PATENT DOCUMENTS

GB    1178566    1/1970

OTHER PUBLICATIONS

European Search Report dated Feb. 1, 2006.

* cited by examiner

*Primary Examiner*—A. Sefer
*Assistant Examiner*—Dilinh P Nguyen
(74) *Attorney, Agent, or Firm*—Jimmy L. Funke

(57) ABSTRACT

A power semiconductor device package utilizes integral fluid conducting micro-channels, one or more inlet ports for supplying liquid coolant to the micro-channels, and one or more outlet ports for exhausting coolant that has passed through the micro-channels. The semiconductor device is mounted on a single or multi-layer circuit board having electrical and fluid interconnect features that mate with the electrical terminals and inlet and outlet ports of the device to define a self-contained and self-sealed micro-channel heat exchanger.

7 Claims, 6 Drawing Sheets

POWER SEMICONDUCTOR PACKAGE HAVING INTEGRAL FLUID COOLING

RELATED APPLICATIONS

This application relates to U.S. patent application Ser. No. 10/919,168, filed on 16 Aug. 2004, now U.S. Pat. No. 7,215,547 B2, and assignee to the assignee of the present invention.

TECHNICAL FIELD

The present invention relates to fluid cooling of power electronics, and more particularly to power semiconductor device packages having integral fluid cooling channels.

BACKGROUND OF THE INVENTION

Various types of cooling mechanisms can be used to remove waste heat from high power semiconductor devices such as power FETs and IGBTs. In cases where the waste heat and/or the ambient temperature are very high, the power devices can be mounted on a liquid-cooled heat exchanger or cold plate. The cold plate has internal fluid conducting channels and inlet and outlet pipes for coupling it to a cooling system including a fluid reservoir, a pump and an external heat exchanger. Due to limited thermal conduction between the power devices and the cold plate, the cold plate must be relatively large and the pump must be capable of producing high fluid flow. As a result, such cooling systems tend to be too large, too heavy and too expensive for many applications. Accordingly, what is needed is an easily-packaged, cost-effective way of cooling high power semiconductor devices.

SUMMARY OF THE INVENTION

The present invention is directed to an improved power semiconductor device package having integral fluid conducting micro-channels, an inlet port for receiving liquid coolant, and an outlet port for exhausting coolant that has passed through the micro-channels. The device is mounted on a single or multi-layer circuit board having electrical and fluid interconnect features that mate with the electrical terminals and inlet and outlet ports of the device to define a self-contained and self-sealed micro-channel heat exchanger. Integral fluid cooling eliminates the thermal gap media such as pads or thermal grease between semiconductor devices and heat exchangers, resulting in lower thermal resistance and lower package cost.

BRIEF DESCRIPTION OF THE DRAWINGS

FIG. 1A depicts an upper surface of the chip, while FIG. 1B depicts a lower surface of the chip.

FIG. 4A depicts an upper surface of the circuit board, FIG. 4B is a sectional view of the circuit board taken along section lines C-C FIG. 4A, and FIG. 4C is a cross-sectional diagram of the package mechanization taken along section lines C-C FIG. 4A.

FIG. 5A depicts an upper surface of the circuit board, and FIG. 5B is a cross-sectional diagram of the package mechanization taken along section lines D-D of FIG. 5A.

DESCRIPTION OF THE PREFERRED EMBODIMENT

Figure 6:
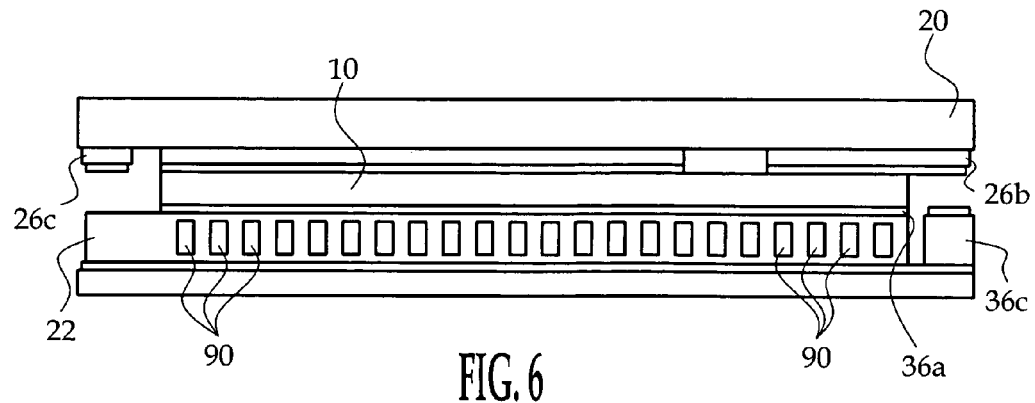
FIG. 6 depicts a third alternate mechanization this invention, where micro-channels are formed in the ceramic of the lower substrate of FIG. 2B.
Figure 7:
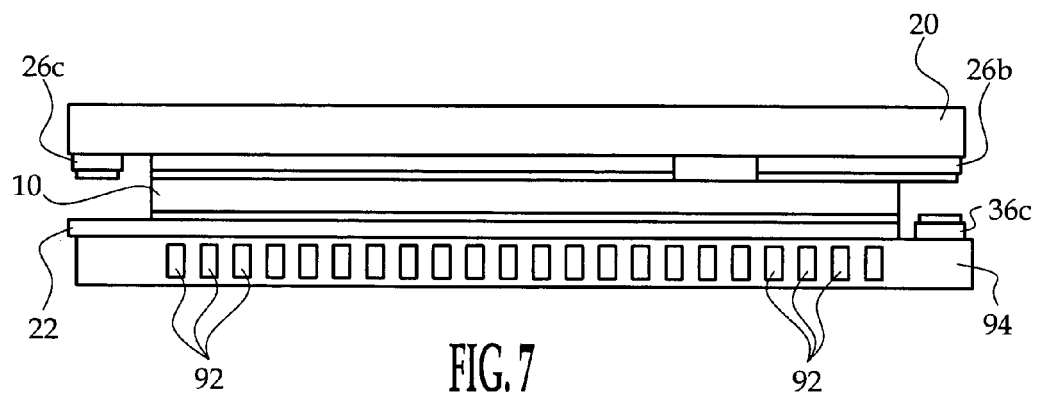
FIG. 7 depicts a fourth alternate mechanization this invention, where micro-channels are formed in a metallization layer on the bottom of the lower substrate of FIG. 2B.
Figure 8:
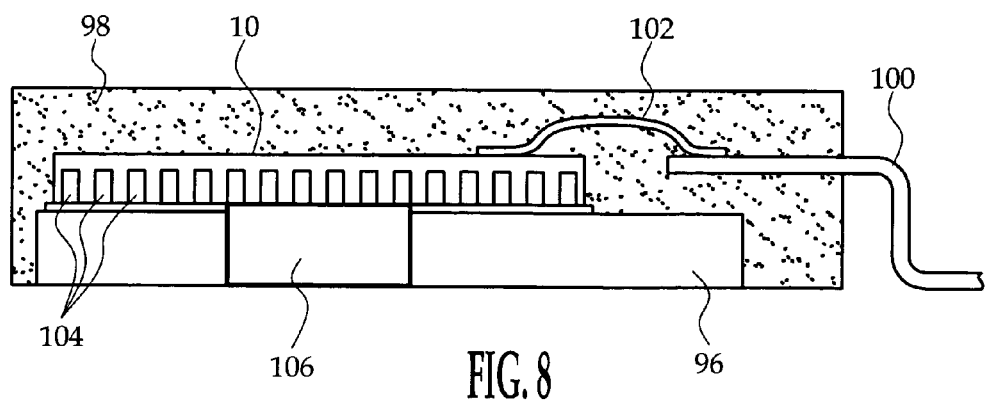
FIG. 8 depicts an application of the present invention to a semiconductor power device package in which a semiconductor chip is sealingly mounted to a metal substrate and over-molded with plastic.

In general, the present invention is directed to power semiconductor device packages including a power semiconductor device with integral fluid conducting micro-channels and a mating single or multi-layer substrate having features that define electrical and fluid interconnects with the semiconductor device. While the method of the present invention may be applied to various types of power semiconductor packages, it is primarily disclosed herein in the context of a power semiconductor package where a semiconductor chip is sandwiched between upper and lower substrates, and the lower substrate is mated to a single or multi-layer circuit board. The integral micro-channel cooling features of this invention may be formed in the semiconductor chip itself as shown in the embodiments of FIGS. 1-4, in the upper substrate as shown in the embodiment of FIG. 5, or in or on the bottom substrate as shown in the embodiments of FIGS. 6-7. FIG. 8 depicts an alternate power semiconductor package in which a semiconductor chip is sealingly mounted to a substrate and over-molded with plastic; in this case, the integral micro-channel cooling features of this invention are formed in the semiconductor chip, as in the embodiments of FIGS. 1-4.

Figure 1A:
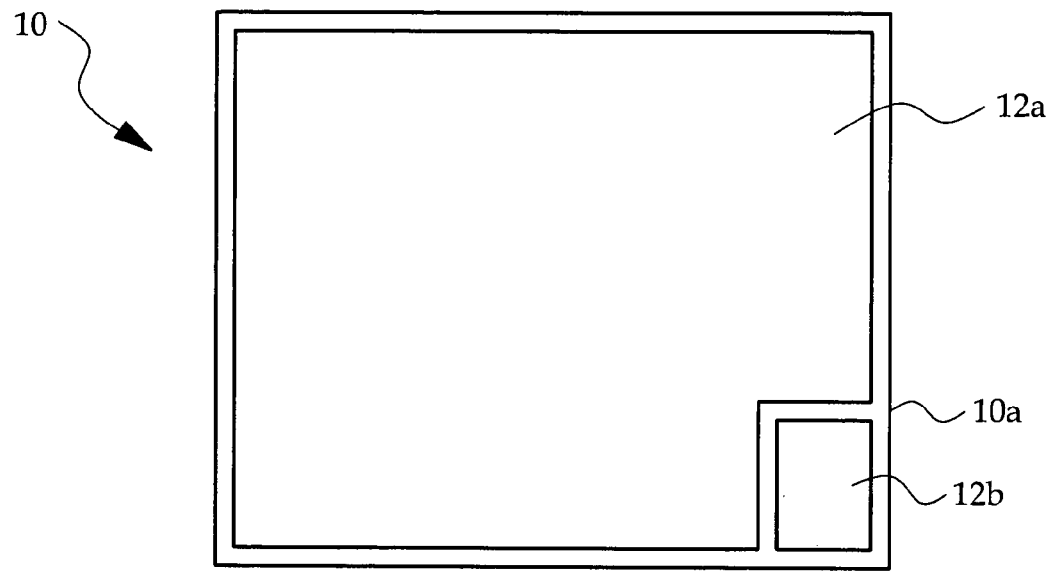
FIGS. 1A-1B depict a semiconductor chip according to this invention.
Figure 1B:
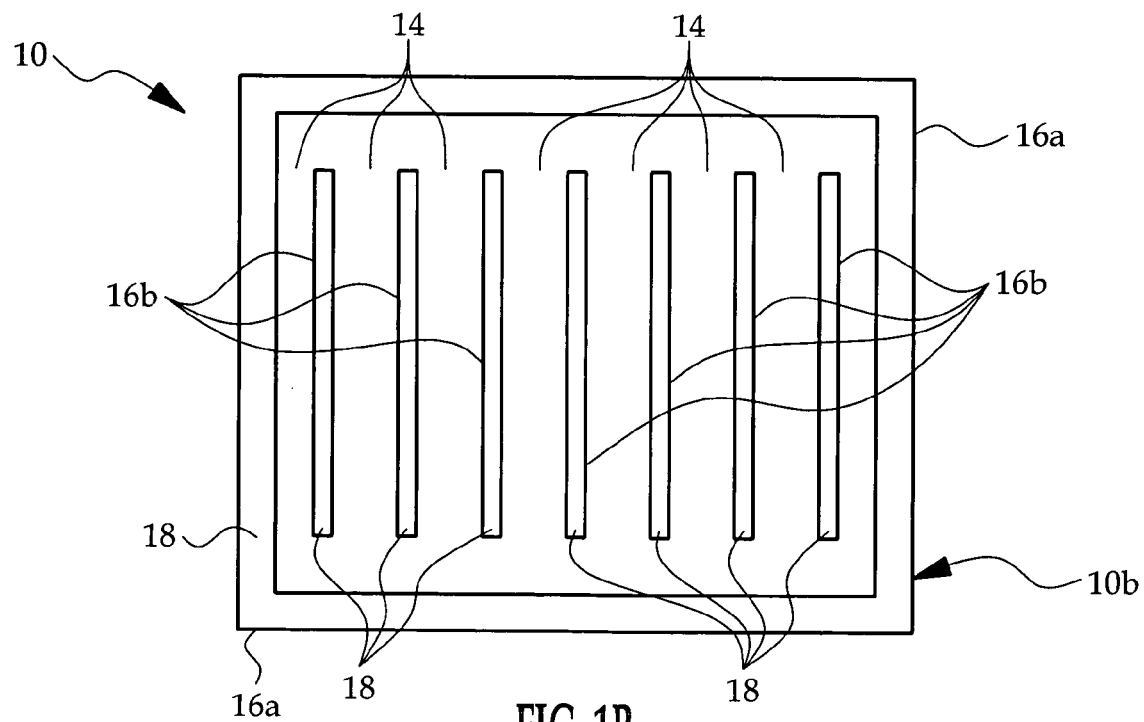

Referring to FIGS. 1A-1B, 2A-2B and 3A-3B, the reference numeral 10 generally designates a three-terminal semiconductor chip such as a power field-effect transistor (FET). A first major surface of the chip 10 (referred to herein as the upper surface 10a) is depicted FIG. 1A, while a second major surface of the chip 10 (referred to herein as the lower surface 10b) is depicted in FIG. 1B. The upper surface 10a is generally planar and supports two solderable conductor pads 12a, 12b. The pad 12a is internally connected to the FET source, while the pad 12b is internally connected to the FET gate. The lower surface 10b is partially recessed in inactive regions of the chip 10 by an etching or similar process to define a number of parallel micro-channels 14. The un-recessed portions of the surface 10b include a marginal region 16a and a plurality of walls 16b between adjacent micro-channels 14. The marginal region 16a and the ends of walls 16b lie in the same plane, and are covered with solderable conductor segments 18 that are each internally connected to the FET drain.

Figure 2A:
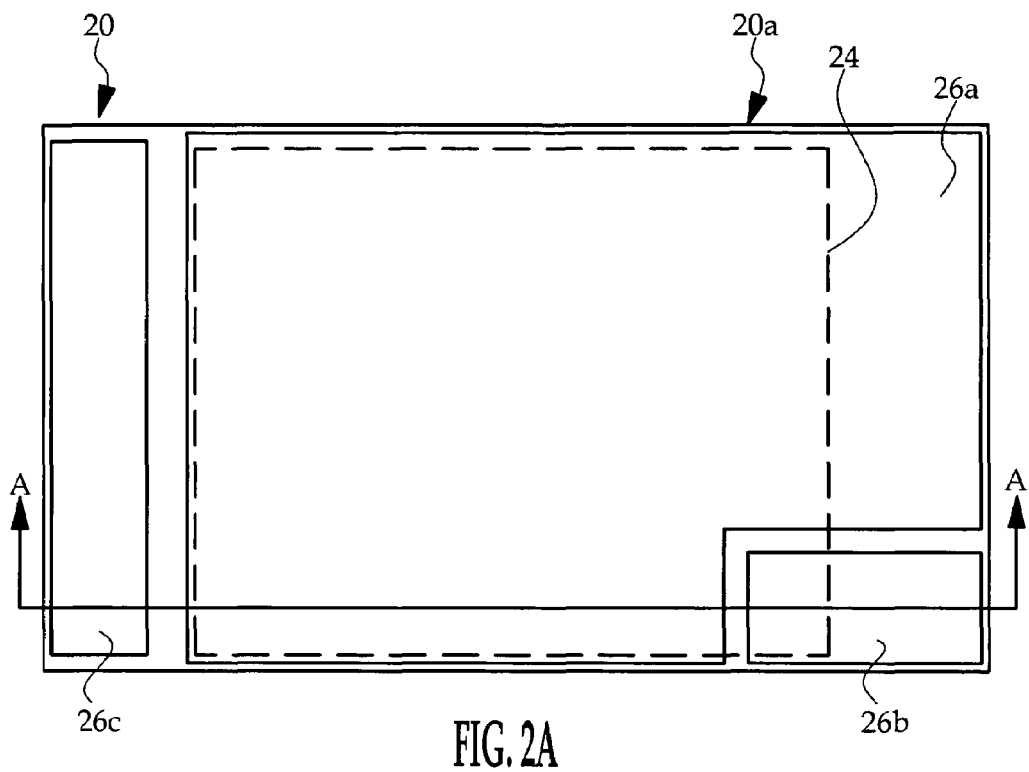
FIG. 2A depicts an upper ceramic substrate that interfaces with the upper surface of the chip of FIGS. 1A-1B.
Figure 2B:
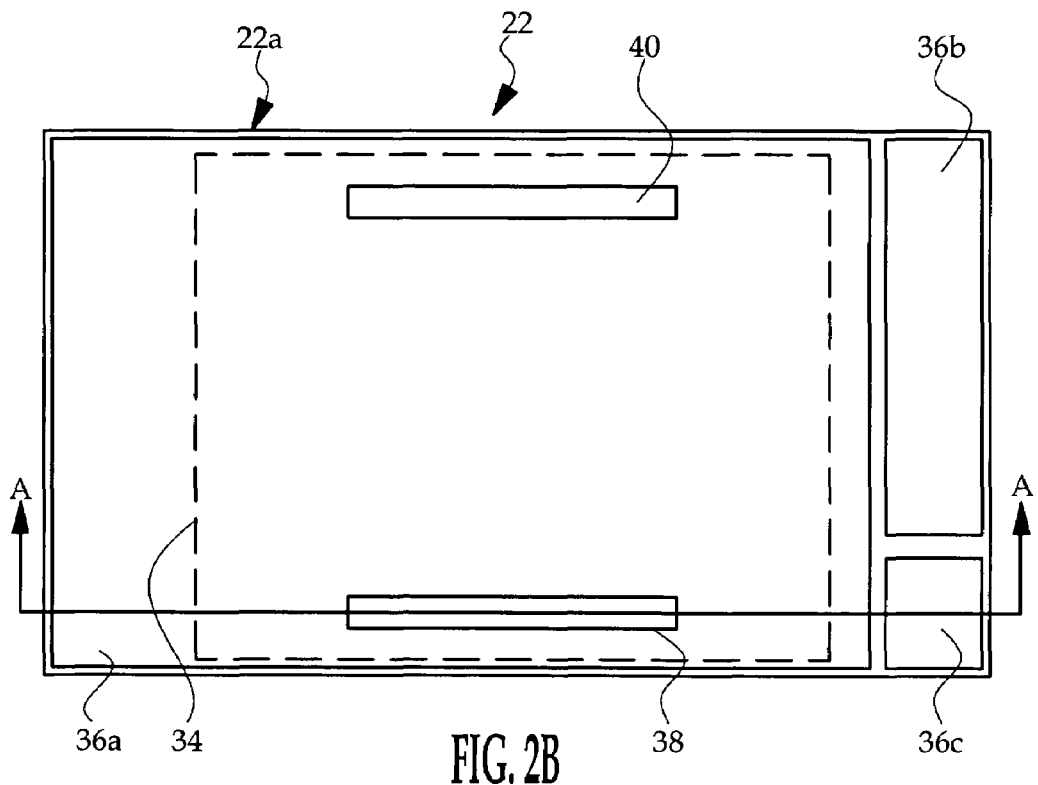
FIG. 2B depicts a lower ceramic substrate that interfaces with the lower surface of the chip of FIGS. 1A-1B.
Figure 3A:
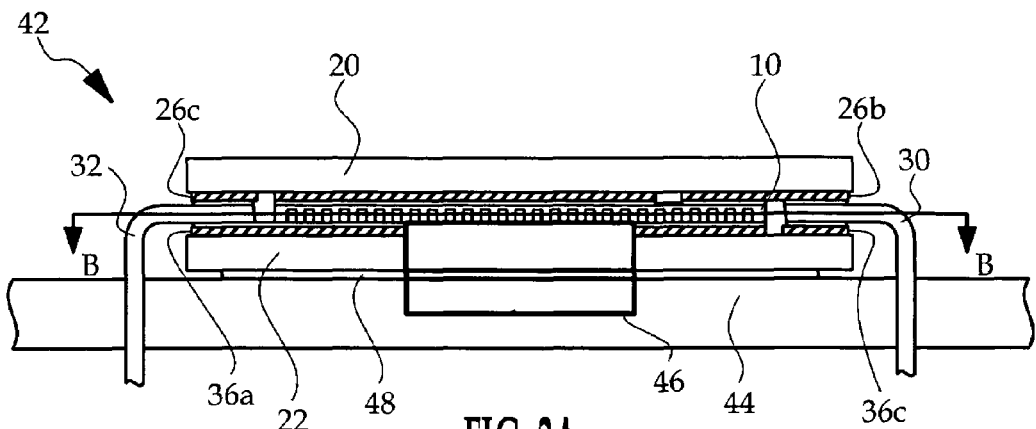
FIG. 3A is a sectional diagram of a semiconductor power device package according to the present invention, including the semiconductor chip of FIGS. 1A-1B, the upper and lower substrates of FIGS. 2A-2B, and a single or multi-layer circuit board, taken along section lines A-A of FIGS. 2A-2B.

The semiconductor chip 10 is sandwiched between a pair of ceramic substrates 20, 22 as best seen in FIG. 3A. The substrate 20 contacts the upper major surface 10a of the chip 10 and is referred to herein as the upper substrate; its chip-contacting face 20a is depicted in FIG. 2A. The substrate 22 contacts the lower major surface 10b of the chip 10 and is referred to herein as the lower substrate; its chip-contacting face 22a is depicted in FIG. 2B.

Figure 3B:
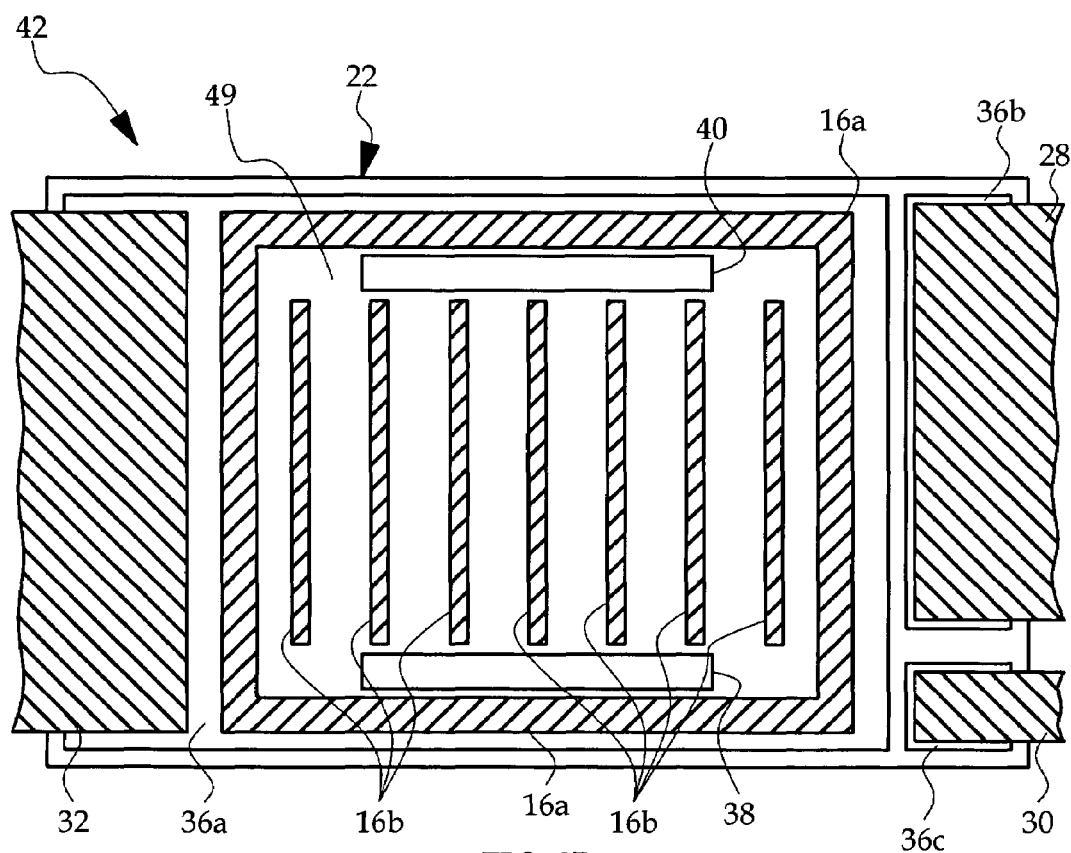
FIG. 3B is a sectional view of the package of FIG. 3A taken along section lines B-B of FIG. 3A.

Referring to FIG. 2A, the position of the chip 10 on the upper substrate 20 is designated by a phantom outline 24. Three solderable conductor pads 26a, 26b, 26c are formed on the substrate face 20a. The pad 26a overlaps the chip conductor pad 12a, but not the chip conductor pad 12b, and extends rightward beyond the outline 24 of chip 10 as viewed in FIG. 2A, to facilitate connection of a first electrical terminal 28 to the FET source, as shown in FIGS. 3A-3B. The pad 26b overlaps the chip conductor pad 12b, but not the chip conductor pad 12a, and extends rightward beyond the outline 24 of chip 10 as viewed in FIG. 2A, to facilitate connection of a second electrical terminal 30 to the FET gate, as shown in FIGS. 3A-3B. The pad 26c lies outside the outline 24 of chip 10, and is soldered to the upper surface of a third electrical terminal 32, as shown in FIGS. 3A-3B.

Referring to FIG. 2B, the position of the chip 10 on the lower substrate 22 is designated by a phantom outline 34. Three solderable conductor pads 36a, 36b, 36c are formed on the substrate face 22a. The pad 36a overlaps the entire outline 34 of the chip 10, and extends leftward beyond the outline 34 of chip 10 as viewed in FIG. 2B, to facilitate connection of the third electrical terminal 32 to the FET drain. The pads 36b and 36c lie outside the outline 34 of chip 10, and are respectively soldered to the lower surfaces of the first and second electrical terminals 28 and 30, as shown in FIGS. 3A-3B. Finally, the lower substrate 22 includes first and second rectangular openings 38, 40 that serve as cooling fluid ports, as explained below.

FIGS. 3A and 3B depict a complete power semiconductor device package 42 built round the chip 10 of FIGS. 1A-1B. Referring to FIG. 3A, the package 42 includes the chip 10; the upper and lower substrates 20, 22; the first, second and third terminals 28, 30, 32; and a single or multi-layer circuit board 44. The conductor pads 12a and 12b (FIG. 1A) of the chip 10 are respectively soldered to the conductor pads 26a and 26b of the upper substrate 20, and the conductor pad segments 18 of the chip 10 are soldered to the conductor pad 36a of lower substrate 22. The first terminal 28 is soldered on its upper face to the conductor pad 26a of upper substrate 20, and on its lower face to the conductor pad 36b of lower substrate 22; in this way, the first terminal 28 is electrically coupled to the FET source. The second terminal 30 is soldered on its upper face to the conductor pad 26b of upper substrate 20, and on its lower face to the conductor pad 36c of lower substrate 22; in this way, the second terminal 30 is electrically coupled to the FET gate. The third terminal 32 is soldered on its upper face to the conductor pad 26c of upper substrate 20, and on its lower face to the conductor pad 36a of lower substrate 22; in this way, the third terminal 32 is electrically coupled to the FET drain. In a typical application, the terminals 28, 30, 32 are bent downward and pass through suitable openings in the circuit board 44 for attachment to a circuit board conductor, as indicated in FIG. 3A. Of particular relevance to the present invention, the circuit board 44 is also provided with first and second rectangular fluid conduits 46 that correspond in shape and alignment with the first and second openings 38, 40 of lower substrate 22. The lower substrate 22 is attached to the circuit board 44 with a sealant adhesive or solder 48 that prevents leakage of cooling fluid between the openings 38, 40 and the corresponding fluid conduits 46.

Referring to FIB 3D, the location of the chip 10 with respect to the lower substrate 22 is such that the solder joint or conductive adhesive between substrate 22 and the marginal region 16a of chip 10 defines a fluid manifold 49 tat encompasses the openings 38, 40 of substrate 22 and the walls 16b of chip 10. Cooling fluid is supplied to the fluid manifold 49 through the substrate opening 38 (also referred to herein as inlet port 38) and a first fluid conduit 46 of circuit board 44 that is aligned with the opening 38. The cooling fluid spreads out in the manifold 49, passes through the micro-channels 14, and is exhausted through the substrate opening 40 (also referred to herein as outlet port 40) and a second fluid conduit 46 of circuit board 44 that is aligned with the opening 40. The fluid conduits 46 of circuit board 44 may be formed in several different ways, as described in related U.S. patent application Ser. No. 10/919,168, filed on 16 Aug. 2004, now U.S. Pat. No. 7,215,547 B2.

Figure 4A:
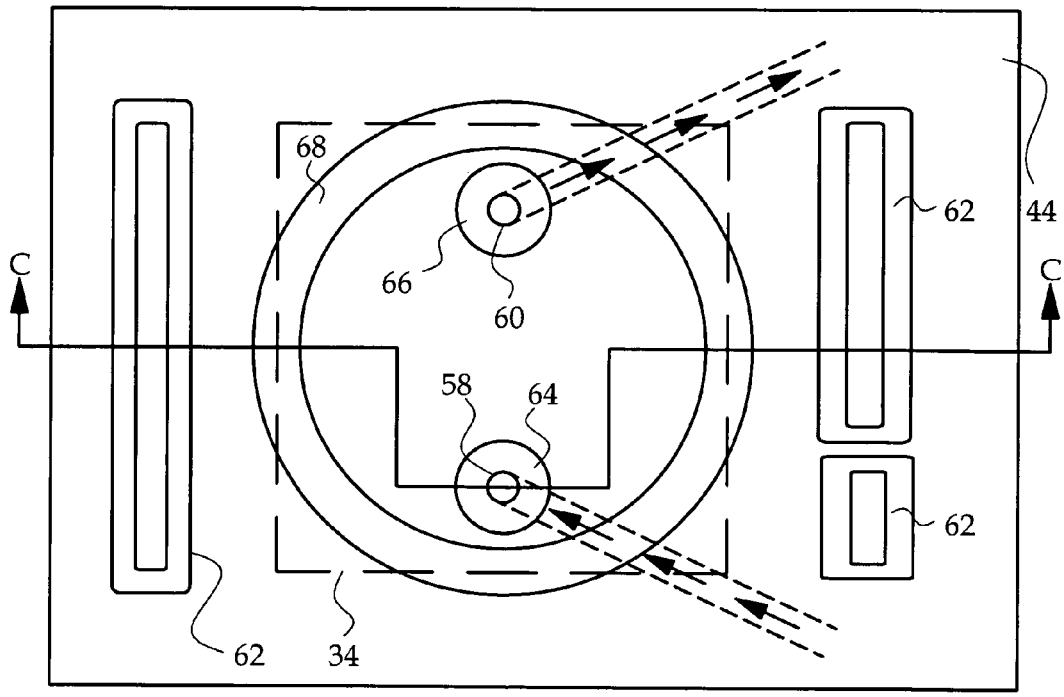
FIGS. 4A-4C depict a first alternate mechanization of this invention.
Figure 4B:
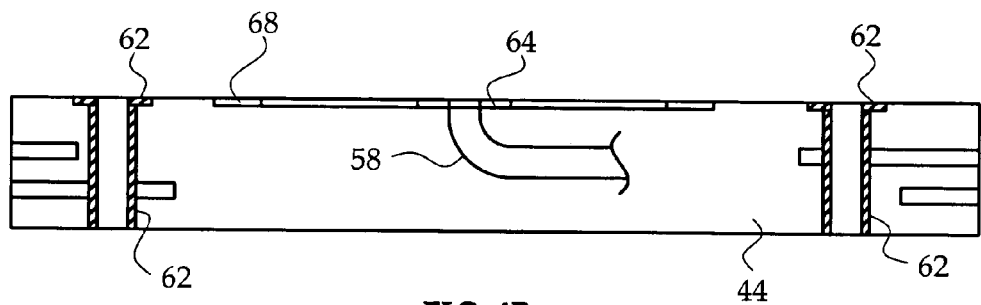
Figure 4C:
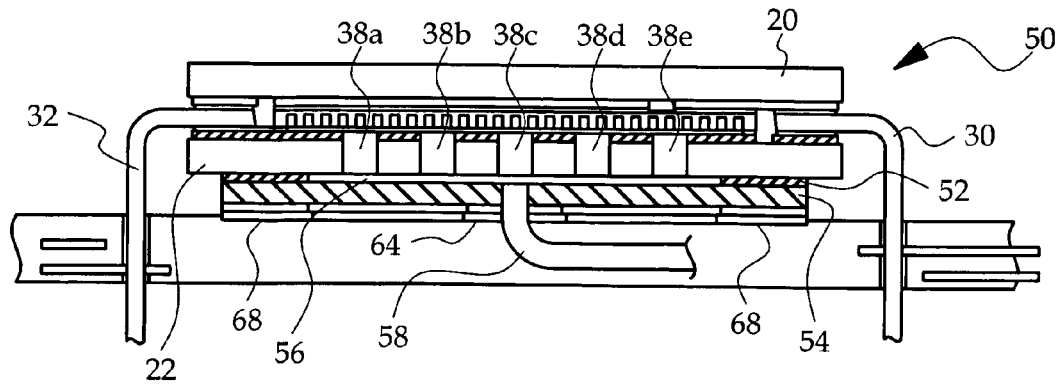

FIGS. 4A-4C depict a power semiconductor device package 50 incorporating several alternate design features. For example, the rectangular substrate openings 38, 40 of package 42 are replaced with a series of square or circular openings for improved coolant flow. The view of FIG. 4C depicts the inlet openings 38a, 38b, 38c, 38d, 38e. Inlet and outlet fluid plenums below the substrate openings are formed by the combination of a braze alloy 52 printed on the bottom face of substrate 22 except in the vicinity of the substrate openings and a copper or aluminum plate 54 brazed to the braze alloy 52. The alloy-free areas in the vicinity of the substrate openings define inlet and outlet plenums for interfacing the inlet and outlet conduits 58, 60 to the inlet and outlet openings in substrate 22. As depicted in the view of FIG. 4C, coolant is supplied to the inlet plenum 56 by a tubular supply conduit 58 that passes through an opening in plate 54; not shown in FIG. 4C is a tubular exhaust conduit 60 (see FIG. 4A) that similarly passes through an opening in plate 54 to exhaust coolant from the outlet plenum. FIGS. 4A-4B illustrate an interface between the plate 54 and the circuit board 44. As indicated, the circuit board 44 is provided with metalized vias 62 for receiving the device terminals 28-32, metalized rings 64 and 66 surrounding the conduits 58 and 60, respectively, and a metalized ring 68 surrounding the rings 64, 66. As seen in FIG. 4C, the plate 54 is soldered to the circuit board 44 at metalized rings 64-68, forming a perimeter mechanical support for the device and fluid seals around the conduits 58 and 60.

Figure 5A:
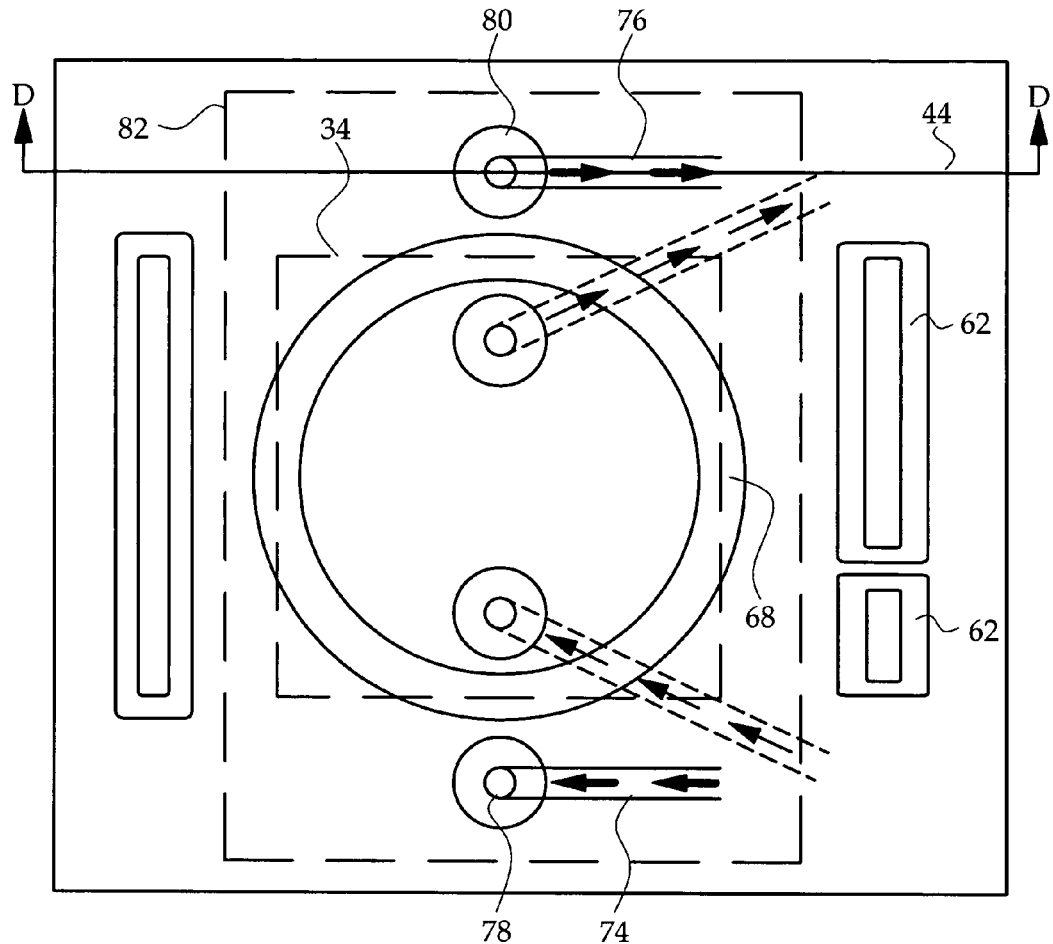
FIGS. 5A-5B depict a second alternate mechanization of this invention where micro-channels are formed in the upper substrate.
Figure 5B:
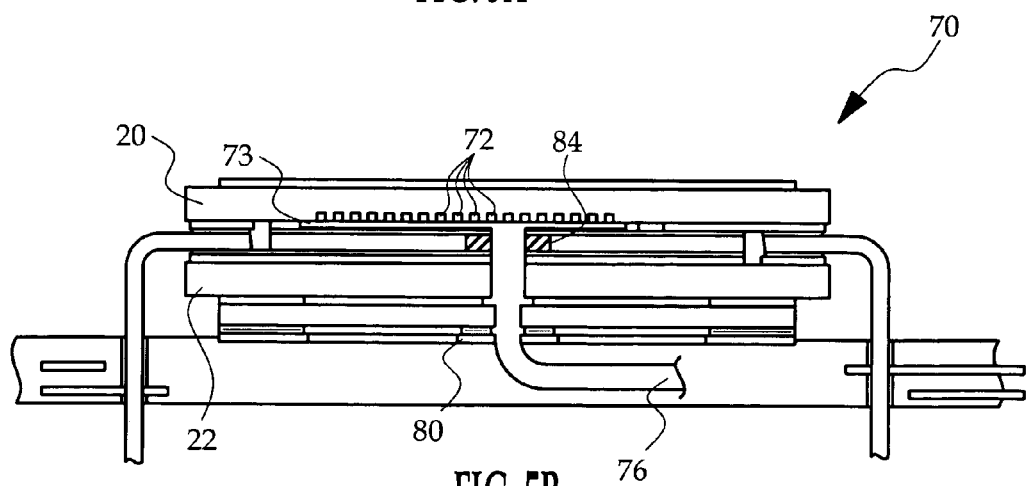

FIGS. 5A-5B depict a power semiconductor device package 70 in which additional cooling is achieved by supplying coolant to a set of parallel micro-channels 72 formed on the inboard side of upper substrate 20 and surrounded by a fluid manifold 73. The construction of the package 70 is similar to that of the package 50, except that the substrates 20, 22 and plate 54 are widened as designated by the reference numeral 82 to accommodate an additional set of fluid conduits 74, 76 laterally outboard of the metalized ring 68 that supply fluid to, and exhaust fluid from, the fluid manifold 73. As seen in FIG. 5A, the circuit board 44 includes a pair of metalized rings 78, 80 surrounding the fluid conduits 74, 76; the plate 54 has a similar metallization pattern and set of openings, and the plate 54 is soldered to the circuit board 44 at metalized rings 78, 80, forming fluid seals around the conduits 74, 76. Since the fluid conduits 74, 76 are also laterally outboard of the IC chip 10 (the outline of which is designated by the reference numeral 34 in FIG. 5A) a pair of solderable annular spacers having the same thickness as the IC chip 10 are placed in vertical alignment with the fluid conduits 74, 76, in the same plane as the IC chip 10, and soldered to metalized rings formed on the upper and lower substrates 20, 22. In FIG. 5B, the spacer for the fluid conduit 76 is designated by the reference numeral 84.

FIG. 6 illustrates a further variation of the invention, where a set of parallel micro-channels 90 are formed in the lower substrate 22. Liquid coolant can be supplied to and exhausted from the micro-channels 90 as described above in respect to FIGS. 3B-5B. The micro-channels 90 may be formed by manufacturing the substrate 22 in upper and lower halves that are joined following or prior to formation of surface features that define the channels and fluid manifolds.

FIG. 7 depicts a variant of the embodiment of FIG. 6, where set of parallel micro-channels 92 are formed in a conductor layer 94 bonded to the lower substrate 22. As with die embodiment of FIG. 6, liquid coolant can be supplied to and exhausted from the micro-channels 92 as described above in respect to FIGS. 3B-5B. In this case, the micro-channels 92 may be formed by multi-step formation of die conductor layer 94.

Finally, FIG. 8 illustrates the invention as applied to a so-called over-mold semiconductor package, where the IC chip 10 is mounted on a metal or ceramic substrate 96, and a moldable plastic or resinous material 98 such as epoxy is molded over chip 10 and all but the bottom face of the substrate 96. In this case, the substrate 96 can form one of the primary terminals of the IC chip 10, and the other terminals are formed by one or more over-molded terminals 100 attached to the upper face of the IC chip 10 by a wirebond 102, for example. A set of parallel micro-channels 104 are formed in the IC chip 10 as in the other embodiments, and a pair of fluid conduits 106 (one of which is shown in FIG. 8) supply coolant fluid to and from the micro-channels 104 as described above.

In summary, the present invention utilizes integral fluid conducting micro-channels to provide improved cooling in a power semiconductor device package. While described in reference to the illustrated embodiments, it is expected that numerous modifications and variations in addition to those mentioned herein will occur to those skilled in the art. For example, the layout and profile of the micro-channels may be different than shown herein, with corresponding changes in the size and configuration of the inlet and outlet ports, and so on. Accordingly, it is intended that the invention not be limited to the disclosed embodiment, but that it have the full scope permitted by the language of the following claims.

The invention claimed is:

1. A semiconductor package, comprising:
a circuit board having inlet and outlet fluid conduits formed therein;
a first substrate supported on said circuit board;
a semiconductor device including a semiconducting silicon chip supported on a first major surface of said substrate opposite said circuit board and defining at least one conductor pad thereon;
a set of micro-channels form in said semiconducting silicon chip, said micro-channels opening toward said first major surface; and
a fluid manifold formed in said semiconducting silicon chip in circuit with said set of micro-channels, said first substrate including a fluid inlet coupled to said fluid manifold at a first end of said set of micro-channels for delivering coolant fluid from said inlet conduit to said micro-channels, and a fluid outlet coupled to said fluid manifold at a second end of said set of micro-channels opposite said first end for exhausting said coolant fluid from said micro-channels to said outlet conduit, said fluid inlet extending through said substrate and coupled with said circuit board inlet fluid conduit and said fluid outlet extending through said substrate and coupled with said circuit board outlet fluid conduit;
wherein said first substrate is supported on said circuit board to which terminals of said semiconductor device are attached, and
wherein said fluid inlet comprises a series of openings formed in said substrate and opening into said fluid manifold,
said semiconductor package further comprising a plate joined to a second major surface of said first substrate opposite said first major surface with an intervening metallization layer defining a fluid plenum that couples said fluid conduit to said series of openings.

2. The semiconductor package of claim 1, wherein said metallization layer is a braze alloy.

3. The semiconductor package of claim 1, wherein said circuit board includes solderable annular rings surrounding said inlet and outlet conduits, and said annular rings are soldered to said plate for form fluid seals between said plate and said inlet and outlet conduits.

4. The semiconductor package of claim 3, wherein said circuit board includes a solderable margin that surrounds said annular rings, and said margin is soldered to said plate for supporting said plate, first substrate and semiconductor device on said circuit board.

5. A semiconductor package, comprising:
a circuit board having inlet and outlet fluid conduits formed therein;
a first substrate supported on said circuit board;
a semiconductor device including a semiconducting silicon chip supported on a first major surface of said substrate opposite said circuit board and defining at least one conductor pad thereon;
a set of micro-channels form in said semiconducting silicon chip, said micro-channels opening toward said first major surface;
a fluid manifold formed in said semiconducting silicon chip in circuit with said set of micro-channels, said first substrate including a fluid inlet coupled to said fluid manifold at a first end of said set of micro-channels for delivering coolant fluid from said inlet conduit to said micro-channels, and a fluid outlet coupled to said fluid manifold at a second end of said set of micro-channels opposite said first end for exhausting said coolant fluid from said micro-channels to said outlet conduit, said fluid inlet extending through said substrate and coupled with said circuit board inlet fluid conduit and said fluid outlet extending through said substrate and coupled with said circuit board outlet fluid conduit;
a second substrate attached to said semiconductor device opposite said first substrate:
a second set of parallel micro-channels formed in said second substrate;
a second fluid manifold surrounding said second set of micro-channels;
a second fluid inlet coupled to said second fluid manifold at a one end of said second set of micro-channels for delivering coolant fluid thereto, and a second fluid outlet coupled to said second fluid manifold at the other end of said second set of micro-channels for exhausting said coolant fluid therefrom.

6. The semiconductor package of claim 5, wherein said second fluid inlet and said second fluid outlet are disposed laterally outboard of said semiconductor device.

7. The semiconductor package of claim 6, including annular spacers disposed about said second fluid inlet and said second fluid outlet between said first and second substrates, said annular spacers each having a thickness equal to that of said semiconductor device.

* * * * *